United States Patent
Kang

(10) Patent No.: US 6,930,905 B2
(45) Date of Patent: Aug. 16, 2005

(54) VOLTAGE BOOSTING DEVICE FOR A FERROELECTRIC MEMORY DEVICE

(75) Inventor: Hee Bok Kang, Daejeon (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 317 days.

(21) Appl. No.: 10/330,110

(22) Filed: Dec. 30, 2002

(65) Prior Publication Data

US 2004/0042250 A1 Mar. 4, 2004

(30) Foreign Application Priority Data

Aug. 30, 2002 (KR) .............................. 10-2002-0051933

(51) Int. Cl.$^7$ .............................................. G11C 11/22
(52) U.S. Cl. ............. 365/145; 365/189.07; 365/189.09
(58) Field of Search ................................. 365/145, 149, 365/189.07, 189.09, 189.11; 327/536, 537

(56) References Cited

U.S. PATENT DOCUMENTS

| | | | | |
|---|---|---|---|---|
| 5,532,953 A | * | 7/1996 | Ruesch et al. .............. | 365/145 |
| 5,801,989 A | * | 9/1998 | Lee et al. .............. | 365/185.22 |
| 6,285,576 B1 | * | 9/2001 | Kang .......................... | 365/145 |
| 6,721,199 B2 | * | 4/2004 | Kang .......................... | 365/145 |
| 6,781,439 B2 | * | 8/2004 | Tanzawa et al. ............. | 327/536 |

FOREIGN PATENT DOCUMENTS

| JP | 2000-284840 | 10/2000 | ............. G05F/3/24 |
|---|---|---|---|
| JP | 2001-256775 | 9/2001 | ........... G11C/11/22 |

* cited by examiner

*Primary Examiner*—Gene N. Auduong
(74) *Attorney, Agent, or Firm*—Jacobson Holman PLLC

(57) ABSTRACT

A ferroelectric memory device including a main bitline pull-up controller for pulling up a main bitline to a positive voltage, a column selection controller for connecting the main bitline to a data bus by a column selection control signal, a cell array connected between the main bitline pull-up controller and the column selection controller, and a driving voltage booster for comparing a predetermined threshold voltage with a detected power voltage and regulating an output level of the driving voltage according to the comparison result.

26 Claims, 17 Drawing Sheets

VOLTAGE BOOSTING DEVICE FOR A FERROELECTRIC MEMORY DEVICE

BACKGROUND OF THE INVENTION

1. Field of the Invention

The present invention generally relates to ferroelectric memory devices, and more particularly, to a ferroelectric memory device which controls boost of voltages for driving cell arrays.

2. Description of the Background Art

Generally, a ferroelectric random access memory (hereinafter, referred to as 'FRAM') has attracted considerable attention as next generation memory device because it has a data processing speed as fast as a DRAM and conserves data even after the power is turned off.

The FRAM includes capacitors similar to the DRAM, but the capacitors have a ferroelectric substance for utilizing the characteristic of a high residual polarization of the ferroelectric substance in which data is removed low even after eliminating an electric field applied thereto.

FIG. 1 is a characteristic curve illustrating a hysteresis loop of a general ferroelectric substance. As shown in FIG. 1, a polarization induced by an electric field does not vanish but keeps some strength ('d' or 'a' state) even after the electric field is cleared due to existence of a residual (or spontaneous) polarization. These 'd' and 'a' states may be assigned to binary values of '1' and '0' for use as a memory cell.

FIG. 2 is a structural diagram illustrating a unit cell of the FRAM device. As shown in FIG. 2, the unit cell of the conventional FRAM is provided with a bitline B/L arranged in one direction and a wordline W/L arranged in another direction vertical to the bitline B/L. A plateline P/L is arranged parallel to the wordline and spaced at a predetermined interval. The unit cell is also provided with a transistor T1 having a gate connected to an adjacent wordline W/L and a source connected to an adjacent bitline B/L, and a ferroelectric capacitor FC1 having the first terminal of the two terminals connected to the drain terminal of the transistor T1 and the second terminal of the two terminals connected to the plateline P/L.

The data input/output operation of the conventional FRAM is now described as follows. FIG. 3a is a timing diagram illustrating a write mode of the FRAM while FIG. 3b is a timing diagram illustrating a read-mode of the FRAM.

Referring to FIG. 3a, when a chip enable signal CSBpad applied externally transits from a high to low level and simultaneously a write enable signal WEBpad also transits from a high to low level, the array is enabled to start a write mode. Thereafter, when an address is decoded in a write mode, a pulse applied to a corresponding wordline transits from a "low" to "high" level, thereby selecting the cell.

In order to write a binary logic value "1" in the selected cell, a "high" signal is applied to a bitline while a "low" signal is applied to a plateline P/L. In order to write a binary logic value "0" in the cell, a "low" signal is applied to a bitline while a "high" signal is applied to a plateline P/L.

Referring to FIG. 3b, when a chip enable signal CSBpad externally transits from a "high" to "low" level, all bitlines are equalized to a "low" level by an equalization signal before selection of a required wordline.

After each bitline is deactivated, an address is decoded to transit a signal on the required wordline from a "low" to "high" level, thereby selecting a corresponding unit cell. A "high" signal is applied to a plateline of the selected cell to cancel a data Qs corresponding to the logic value "1" stored in the FRAM. If the logic value "0" is stored in the FRAM, a corresponding data Qns will not be destroyed.

The destroyed and non-destroyed data output different values, respectively, according to the above-described hysteresis loop characteristics. As a result, a sense amplifier senses logic values "1" or "0". In other words, as shown in the hysteresis loop of FIG. 1, the state moves from 'd' to 'f' when the data is destroyed while the state moves from 'a' to 'f' when the data is not destroyed.

As a result, the destroyed data amplified by the enabled sense amplifier outputs a logic value "1" while the non-destroyed data amplified by the sense amplifier outputs a logic value "0". After the sense amplifier amplifies the data, the data should be recovered into the original data. Accordingly, when a high signal is applied to the required wordline, the plateline is disabled from "high" to "low".

The operation voltage of the FRAM ranges from low to high values. A boost voltage for driving a low voltage is used in a wordline WL, a plateline PL and a bitline BL in a FRAM cell operation. Here, it is helpful for reliability of chips not to generate excessive voltage in a boost circuit. Also, it is required not to apply the excessive voltage in a Burn-In test for testing reliability under a high temperature and a high voltage.

Because a conventional cell array is provided with a bitline connected to all cells in a column, the whole bitline should be driven to approach a cell. As a result, the driving load of the bitline increases, thereby slowing the driving speed.

SUMMARY OF THE INVENTION

Accordingly, it is an object of the present invention to provide a boost control signal generator which detects voltage levels and deactivates a boost circuit over a threshold voltage. As a result, a FRAM chip may operate normally not by boosting a driving voltage over a threshold voltage.

The boost control signal generator according to the present invention operates only when a chip is activated lest a DC current should flow in a standby mode.

It is another object of the present invention to provide bitlines comprising main bitlines and sub-bitlines. A main bitline is connected to a plurality of sub-bitlines via switches. When a specific cell is approached, only a sub-bitline connected to the specific cell is only connected to a main bitline, thereby decreasing the driving load of the bitline to that of one sub-bitline.

In order to achieve the above-described objects, there is provided a ferroelectric memory device comprising a driving voltage boost device including: a boost control signal generator for generating boost control signals according to the level of power voltage in response to chip enable signals; and a boost circuit for generating boost voltages when the boost control signal is enabled and then supplying the boosted voltage to memory cells.

There is also provided a ferroelectric memory device comprising: a main bitline pull-up controller for pulling up a main bitline to positive voltage in response to a first control signal; a column selection controller for connecting the main bitline with a data bus line in response to a column selection control signal; a cell array connected between the main bitline pull-up controller and the column selection controller; and a driving voltage booster for comparing a predetermined threshold voltage with the detected voltage and regulating a level of a driving voltage according to the comparison result.

DETAILED DESCRIPTION OF THE PREFERRED EMBODIMENTS

The present invention will be described in more detail referring to the accompanying drawings.

Figure 1:
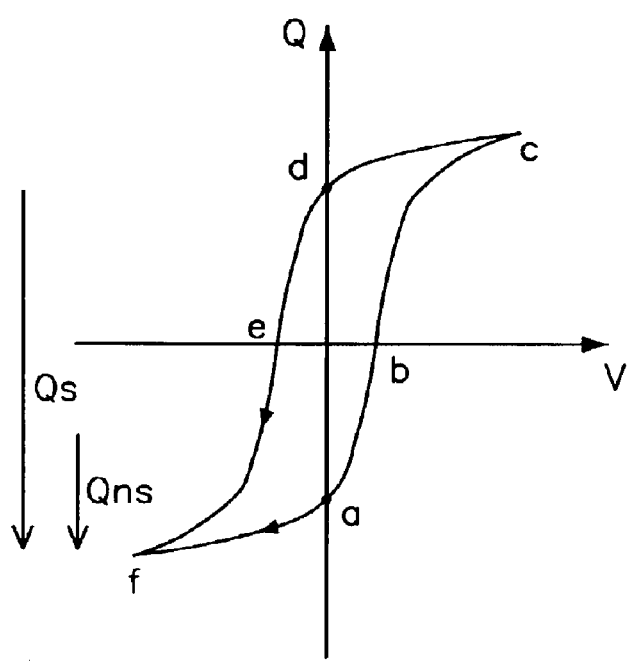
FIG. 1 is a characteristic curve illustrating a hysteresis loop of a general ferroelectric substance.
Figure 2:
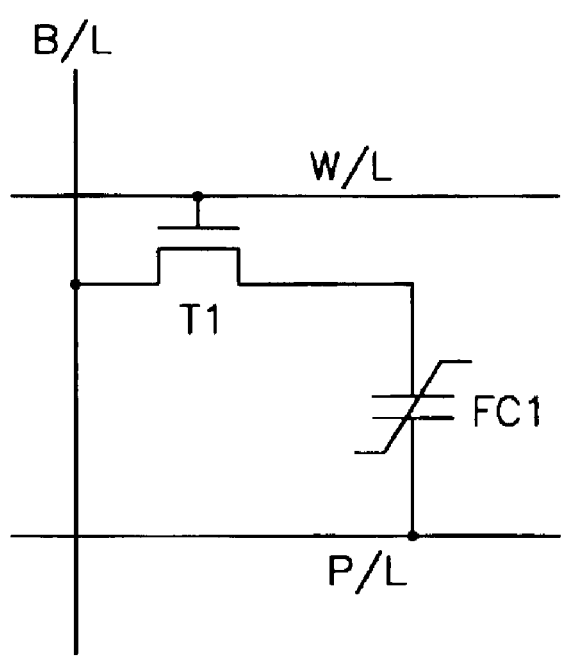
FIG. 2 is a structural diagram illustrating a FRAM cell device.
Figure 3A:
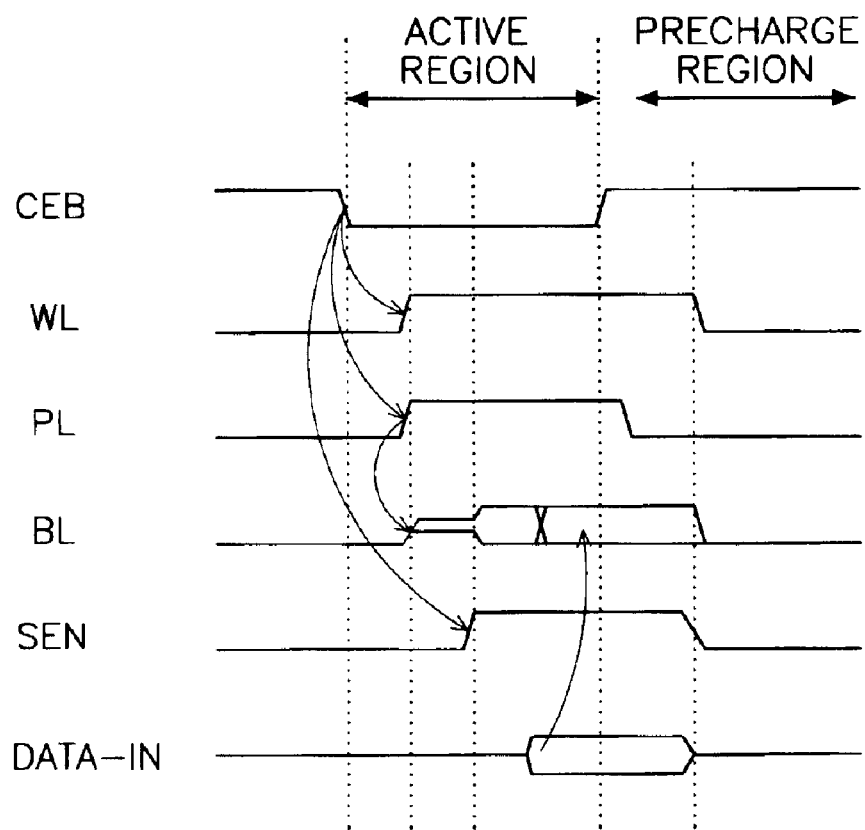
FIG. 3 is a timing diagram illustrating read/write operations of a conventional ferroelectric memory device.
Figure 3B:
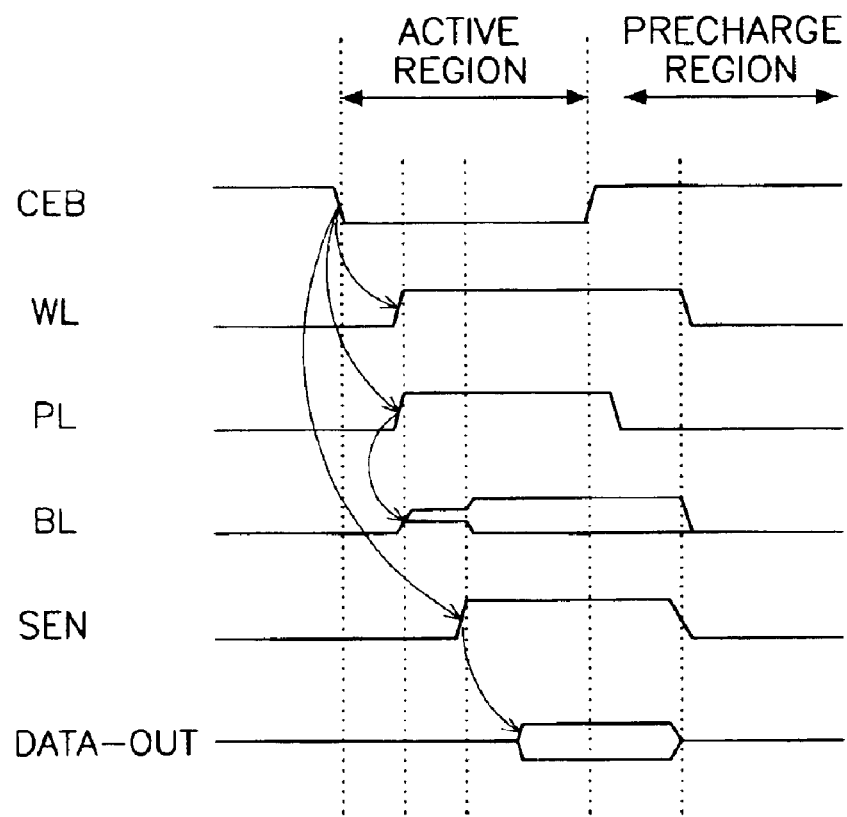
Figure 4:
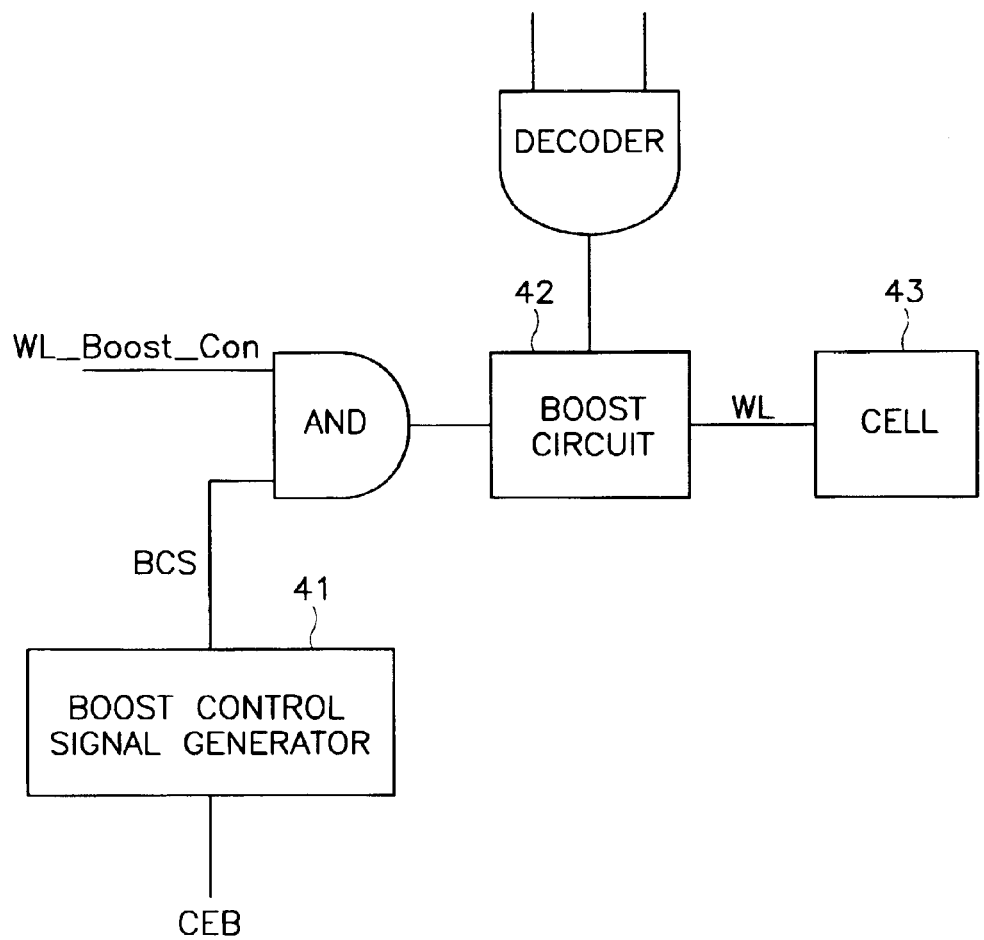
FIG. 4 is a block diagram illustrating a wordline booster according to the present invention.

FIG. 4 is a block diagram illustrating a wordline driving voltage booster according to the present invention. The driving voltage booster comprises a boost control signal generator 41 and a boost circuit 42. The boost circuit 42 regulates levels of output voltages in response to output of the boost control signal generator 41.

A NAND gate NANDs a control signal WL_Boost_Con for controlling wordline voltage boosting and an output of the boost control signal generator 42, and then the output of the NAND gate is inputted into the boost circuit 41. When the control signal WL_Boost_Con or a boost control signal BCS is disabled, the boost circuit 41 does not boost a driving voltage of a wordline WL.

The boost control signal generator 41 operates only when a chip enable signal CEB is enabled. A DC current does not flow in the boost control signal generator 41 when the chip enable signal CEB is disabled.

Figure 5:
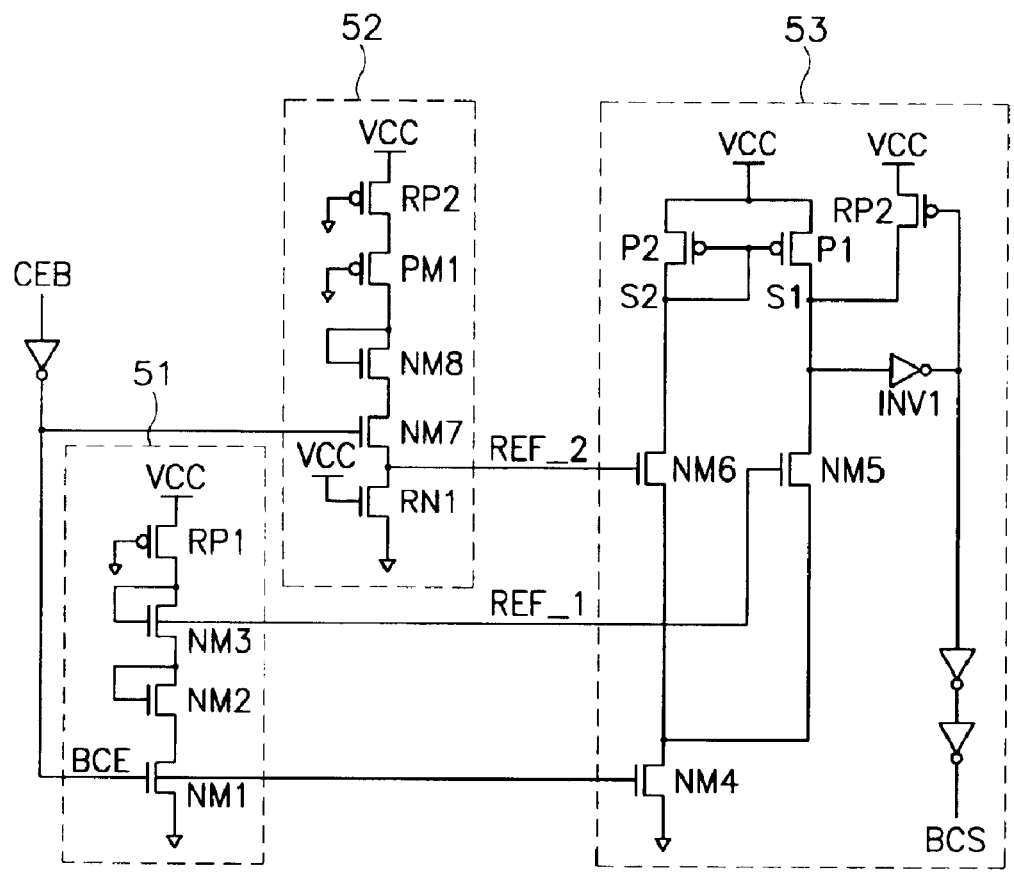
FIG. 5 is a circuit diagram illustrating a boost control signal generator in accordance with a first preferred embodiment of the present invention.

FIG. 5 is a circuit diagram illustrating a boost control signal generator in accordance with a first preferred embodiment of the present invention. The boost control signal generator comprises a target voltage generator 51, a voltage detector 52 and a comparator 53.

The target voltage generator 51 sets a first reference voltage REF_1 when a chip enable signal BCE is enabled. The first reference voltage is a threshold voltage set to prevent the excessive boost of driving voltages. The chip enable signal BCE is internally used by inverting a chip enable signal CEB inputted externally. In this preferred embodiment, the chip enable signal CEB is at a "low" level and the chip enable signal BCE is at a "high" level when they are enabled.

The target voltage generator 51 comprises a PMOS transistor RP1, a NMOS transistor NM3, a NMOS transistor NM2 and a NMOS transistor NM1. The PMOS transistor RP1 has a gate connected to the ground and a source connected to a Vcc. The NMOS transistor NM3 has a gate connected to a drain connected to the drain of the PMOS transistor RP1. The NMOS transistor NM2 has a gate connected to a drain connected to the source of the NMOS transistor NM3. The NMOS transistor NM1 has a gate whereto a chip enable signal BCE is inputted, a drain connected to the source of the NMOS transistor NM2 and a source connected to the ground. Here, the first reference voltage REF_1 is identical with the gate voltage of the NMOS transistor NM3.

The chip enable signal BCE activates The NMOS transistor NM1 used for a switching device. The level of the first reference voltage REF_1 outputted from the target voltage generator 51 is determined by the PMOS transistor RP1, a resistant device, and the NMOS transistors NM2 and NM3 which are diode-connected transistors.

The NMOS transistors NM2 and NM3 have the first reference voltage REF_1 determined by a threshold voltage Vth of NMOS transistors. When the two NMOS transistors are connected in series, (2×Vth) becomes the first reference voltage REF_1. According to voltage demand of the circuit, N NMOS transistors may be used. In the same way, when N NMOS transistors are connected in series, (N×Vth) becomes the first reference voltage REF_1.

The PMOS transistor RP1 is a resistant device for precharging the first reference voltage REF_1 to a "high" level by flowing very little current. As a result, the reference voltage REF_1 is precharged to a "high" level in a standby mode. This device is used for regulating the first reference voltage REF_1 in a fine level area difficult set by the NMOS transistors NM2 and NM3.

The voltage detector 52 generates a second reference voltage REF_2 to compare with the first reference voltage REF_1. Boosting is carried out only when the second reference voltage REF_2, a detection voltage, is smaller than the first reference voltage.

The voltage detector 52 comprises a PMOS transistor RP2, a PMOS transistor PM1, a NMOS transistor NM8, a NMOS transistor NM7 and a NMOS transistor RN1. The PMOS transistor RP2 has a gate connected to the ground and a source connected to a Vcc. The PMOS transistor PM1 has a gate connected to the ground, a source connected to the drain of the PMOS transistor PM2. The NMOS transistor NM8 has a gate and a drain connected to the drain of the PMOS transistor PM1. The NMOS transistor NM7 has a gate whereto a chip enable signal BCE is inputted and a drain connected to the source of the NMOS transistor NM8. The NMOS transistor RN1 has a gate connected to a Vcc, a drain connected to the source of the NMOS transistor and a source connected to the source. Here, the second reference voltage REF_2 is outputted from the drain of the NMOS transistor RN1.

The process of forming the second reference voltage REF_2 is opposite to that of forming the first reference voltage REF_1. A node of the second reference voltage REF_2 is reset to a "low" level via the resistant NMOS transistor RN1 during the precharge interval.

When the chip enable signal BCE is enabled, the switch device NM7 is turned-on. The second reference voltage REF_2, the output of the voltage detector 52, is determined by the NMOS transistor NM8, the PMOS transistors PM1 and PM2 which are diode-connected transistors.

The comparator 53 compares the first reference voltage REF_1 with the second reference voltage REF_2.

The comparator 53 comprises a first PMOS transistor P1, a second PMOS transistor P2, a NMOS transistor NM5, a NMOS transistor NM6, a NMOS transistor NM4, an inverter INV1 and a PMOS transistor RP2. The first PMOS transistor P1 has a source connected to a Vcc. The second PMOS transistor P2 has a gate connected to the gate of the first transistor P1, a source connected to a Vcc and a drain connected to a gate. The NMOS transistor NM5 has a gate whereto the first reference voltage REF_1 is inputted and a drain connected to the drain of the first PMOS transistor P1. The NMOS transistor NM6 has a gate whereto the second reference voltage REF_2 is inputted and a drain connected to the drain of the second PMOS transistor. The NMOS transistor NM4 has a gate whereto the chip enable signal BCE is inputted, a drain connected to the sources of the NMOS transistors NM5 and NM6 and a drain connected to the ground. The inverter INV1 has an input terminal connected to the drain of the first PMOS transistor P1. The PMOS transistor RP2 has a gate connected to the output terminal of the inverter INV1, a source connected to a Vcc and a drain connected to the drain of the first PMOS transistor P1. Here, the logic level of the boost control signal BCS is identical with that of the output of the inverter INV1. The even number of inverters may be connected in series with the inverter INV1. In FIG. 5, two inverters are added.

As described above, the first reference voltage REF_1 is set at a "high" level and the second reference voltage and REF_2 is set at a "low" level during the precharge. The output node S1 is pulled-up to a "high" level by the resistant PMOS transistor RP2.

When the chip enable signal BCE is enabled to a "high" level, the NMOS transistor NM4 is turned-on and the first and the second reference voltages REF_1 and REF_2 are inputted into the NMOS transistors NM5 and NM6, respectively, thereby performing a differential amplification.

When the first reference voltage REF_1 is higher than the second reference voltage REF_2, the current flowing through the drain of the NMOS transistor NM5 becomes larger than that flowing through the drain of the NMOS transistor NM6. As a result, the voltage of the node S1 becomes at a "low" level, and then the chip enable signal BCS is at a "high" level. In other words, a boost control signal is enabled when a target voltage is larger than a detection voltage.

On the other hand, when the first reference voltage REF_1 is lower than the second reference voltage REF_2, the current flowing through the drain of the NMOS transistor NM6 becomes larger than that of the NMOS transistor NM5. As a result, the voltage of the node S1 becomes at a "high" level, and then the chip enable signal BCS is at a "low" level. In other words, a boost control signal is disabled when a target voltage is lower than a detected voltage.

Figure 6:
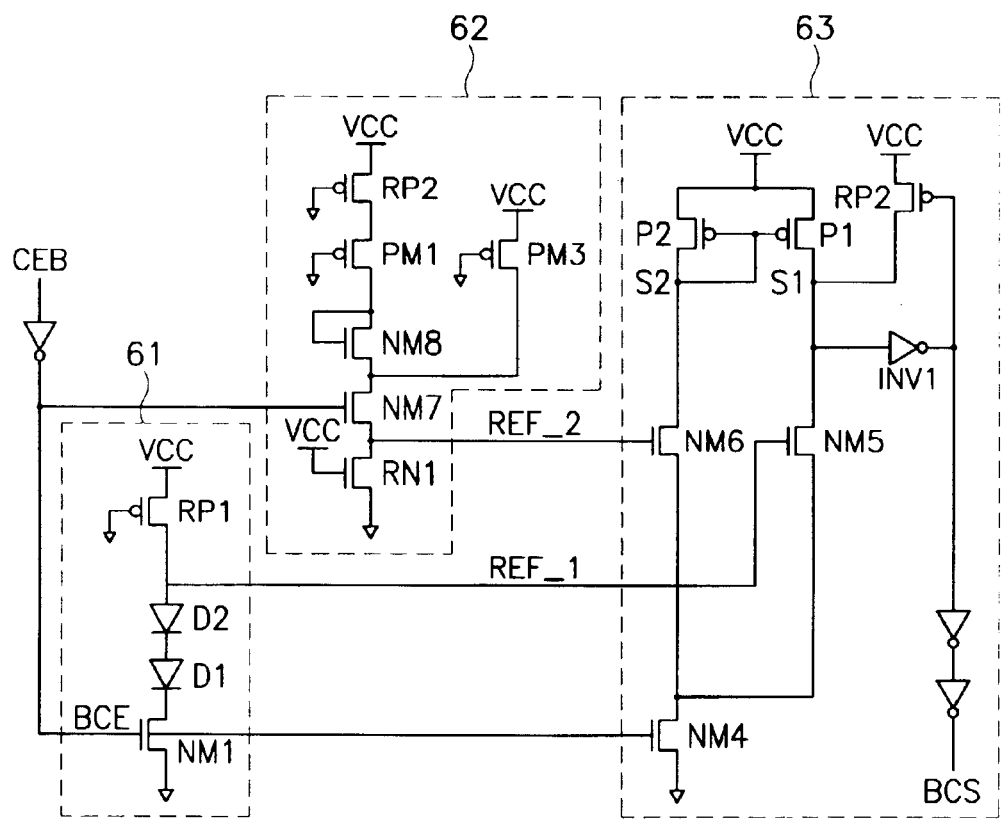
FIG. 6 is a circuit diagram illustrating a boost control signal generator in accordance with a second preferred embodiment of the present invention.

FIG. 6 is a circuit diagram illustrating a boost control signal generator in accordance with a second preferred embodiment of the present invention.

A target voltage generator 61 has the structure similar to that of the target voltage generator 51 in the first preferred embodiment. However, diodes D1 and D2 are used instead of NMOS transistors NM2 and NM3. The detail explanation will be omitted because the function of the circuit is identical with that of the first preferred embodiment.

A voltage detector 62 has the substantially same structure as that of the voltage detector 52 in the first preferred embodiment. However, the voltage detector 62 further comprises a PMOS transistor PM3 The PMOS transistor PM3 has a gate connected to the ground, a source connected to a Vcc and a drain connected to a source of a NMOS transistor NM8.

The amount of the current flowing through the NMOS transistor RN1 may be regulated by adding the PMOS transistor PM3 in the voltage detector 62. As a result, the second reference voltage REF_2 may also be changed. The other functions are identical with those of the voltage detector 52.

A comparator 63 has the same structure and function with those of the comparator 53 in the first preferred embodiment. Accordingly, the explanation will be omitted.

Figure 7:
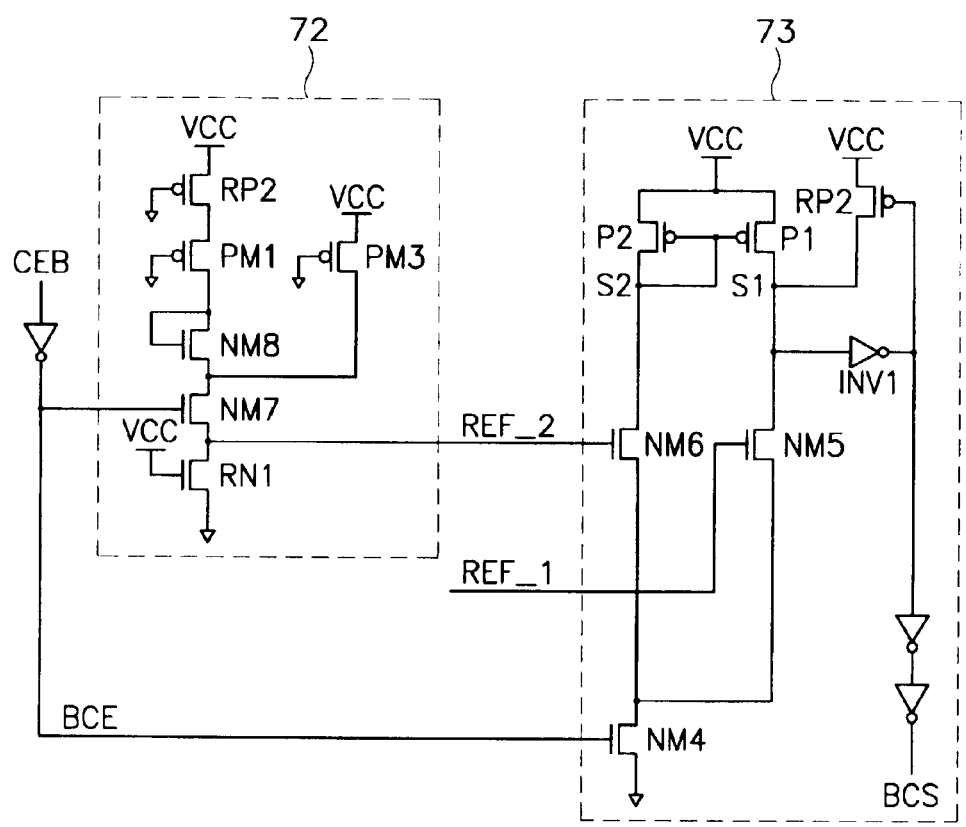
FIG. 7 is a circuit diagram illustrating a boost control signal generator in accordance with a third preferred embodiment of the present invention.

FIG. 7 is a circuit diagram illustrating a boost control signal generator in accordance with a third preferred embodiment of the present invention.

In this preferred embodiment, the first reference voltage REF_1 is provided externally.

A voltage detector 72 and a comparator 73 have the same structure and function with the voltage detector 62 and the comparator 63 in the second preferred embodiment.

Figure 8:
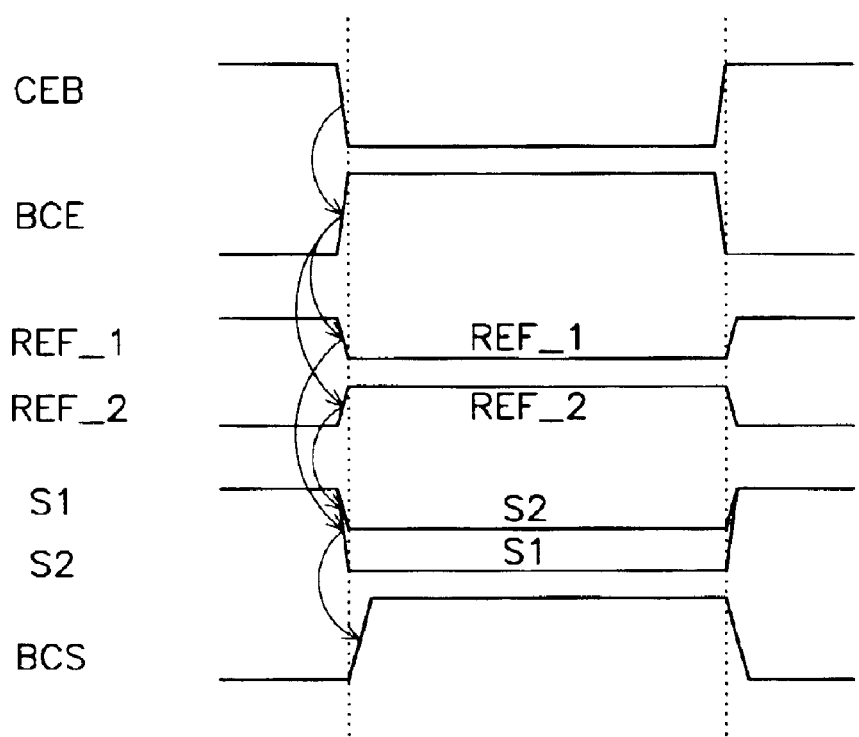
FIG. 8 is a timing diagram of the ferroelectric memory device below a threshold voltage according to the present invention.
Figure 9:
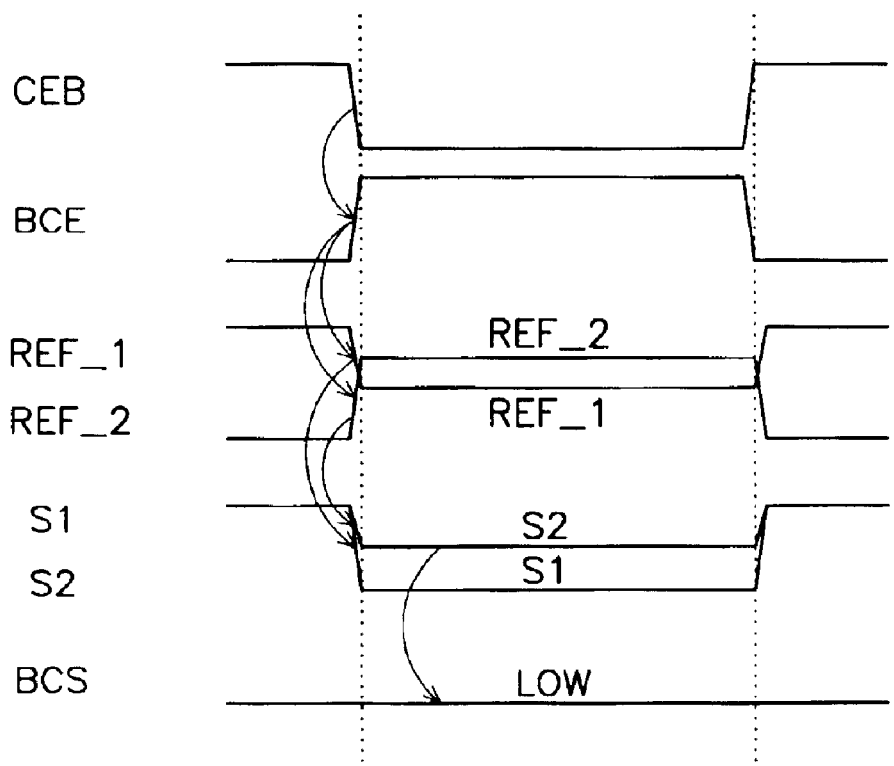
FIG. 9 is a timing diagram of the ferroelectric memory device over a threshold voltage according to the present invention.

FIGS. 8 and 9 are timing diagrams illustrating the operation of the boost control signal generator.

The boost control signal generator of the present invention begins to operate when chip enable signals CEB and BCE are enabled. When the operation begins, the first reference voltage REF_1 is generated in the target voltage generators 51 and 61 and the second reference voltage REF_2 is generated in the voltage detectors 52, 62 and 72.

Referring to FIG. 8, when the first reference voltage REF_1 is higher than the second reference voltage REF_2, an output of the node S1 becomes "low" and the boost control signal BCS becomes "high", thereby boosting a driving voltage.

Referring to FIG. 9, when the first reference voltage REF_1 is lower than the second reference voltage REF_2, an output of the node S1 becomes "high" and the boost control signal becomes "low", thereby blocking the boost operation.

Each component may be variably combined except the above-described preferred embodiments. The first reference voltage REF_1 provided externally may be used instead of the target voltage generator 51, and the voltage detector 62 may be used instead of the voltage detector 52. Accordingly, the specific explanation on the variations will be omitted because the structure and function can be easily understood by a person having an ordinary skill in the art.

Figure 10:
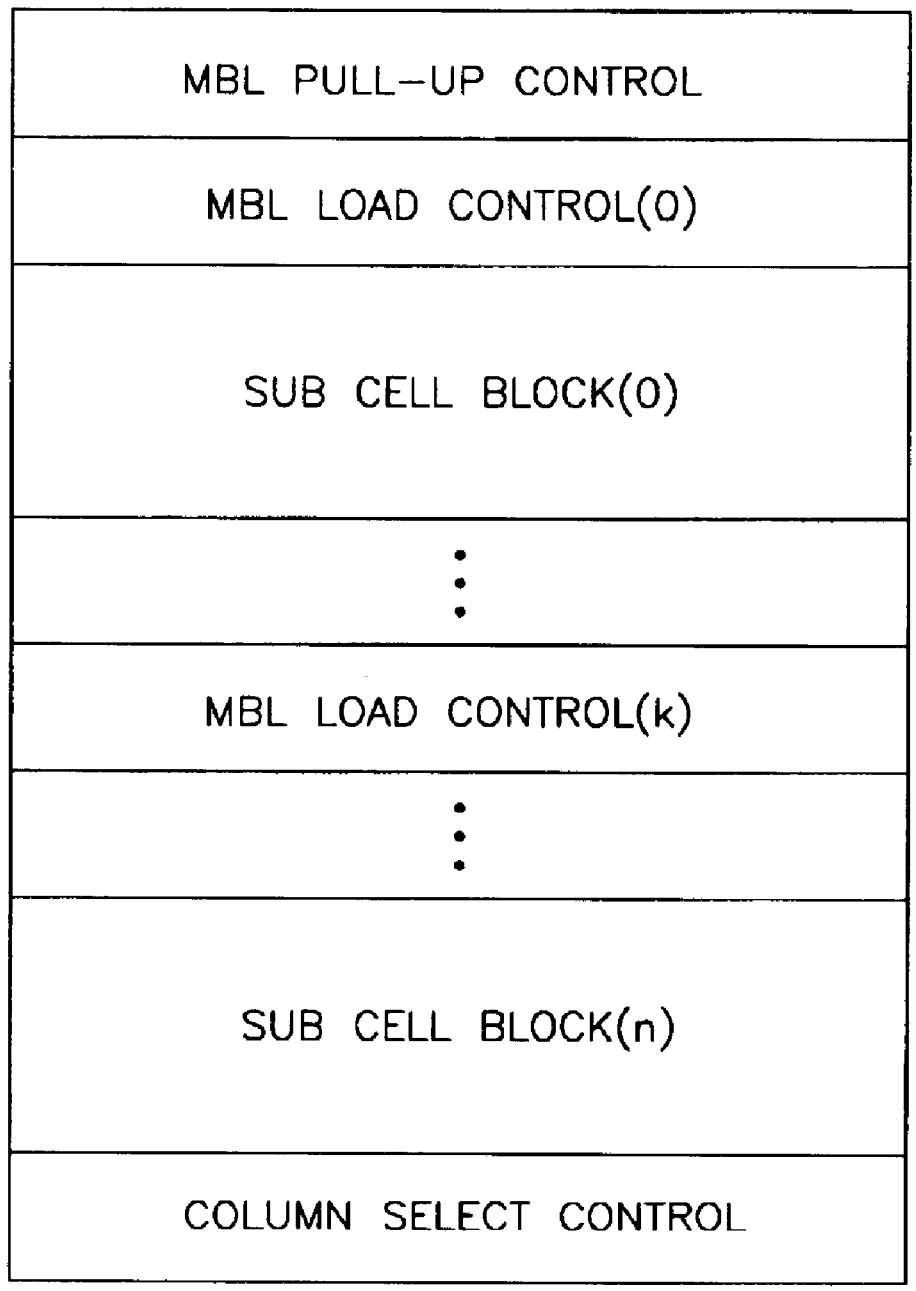
FIG. 10 is a structural diagram illustrating a cell array of the ferroelectric memory device according to the present invention.

FIG. 10 is a structural diagram illustrating a cell array provided with a driving voltage by a driving voltage booster according to the present invention.

Each column in the cell array comprises a main bitline pull-up controller, a cell array and a column selection controller. Particularly, the cell array includes a main bitline load controller, a cell array and a driving booster. The main bitline load controller connected between a positive power (not shown) and a main bitline (not shown) controls the amount of current by control signals (not shown). The cell array comprises a main bitline load controller and a plurality of sub-cell blocks. The driving voltage booster compares a predetermined threshold voltage and a detected power voltage and regulates an output level of the driving voltage to supply the voltage to the memory cell.

Figure 11:
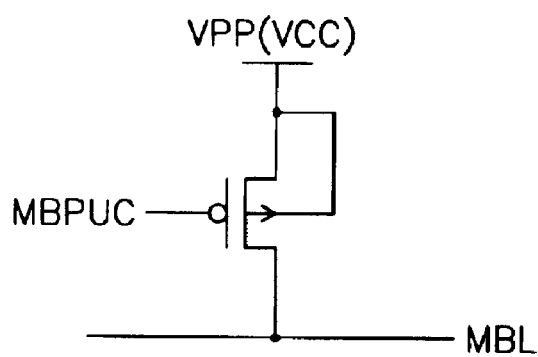
FIG. 11 is a structural diagram illustrating a main bitline pull-up controller of the ferroelectric memory device according to the present invention.

FIG. 11 is a structural diagram illustrating a main bitline pull-up controller of the ferroelectric memory device according to the present invention.

The main bitline pull-up controller comprises a PMOS transistor having a gate whereto a control signal MBPUC is inputted, a source connected to a Vpp or Vcc and a drain connected to a main bitline.

The main bitline pull-up controller pulls up the main bitline to a "high" level during the "precharge".

Figure 12:
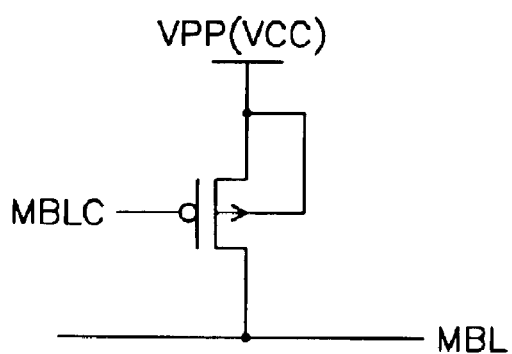
FIG. 12 is a structural diagram illustrating a main bitline load controller of the ferroelectric memory device according to the present invention.

FIG. 12 is a structural diagram illustrating a main bitline load controller of the ferroelectric memory device according to the present invention.

The main bitline load controller comprises a PMOS transistor having a gate whereto a control signal MBLC is inputted, a source connected to a Vpp or Vcc and a drain connected to a main bitline.

When the control signal MBLC is enabled, the main bitline load controller loads a main bitline MBL. A detection voltage of the main bitline MBL is determined by a load resistance and a current level of the main bitline MBL.

One or more main bitline load controllers are connected to each main bitline. When more than one main bitline load controllers are connected, main bitline load controllers are arranged equally apart from each other with the same number of sub-cell blocks between them.

Figure 13:
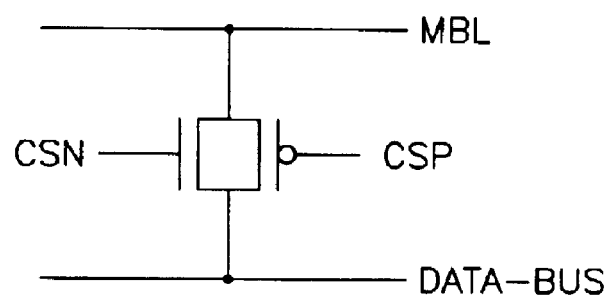
FIG. 13 is a structural diagram illustrating a column selection controller of the ferroelectric memory device according to the present invention.

FIG. 13 is a structural diagram illustrating a column selection controller of the ferroelectric memory device according to the present invention.

The column selection controller comprises a transmission gate connecting a main bitline MBL to a data-bus controlled by column selection control signals CSN and CSP.

Figure 14:
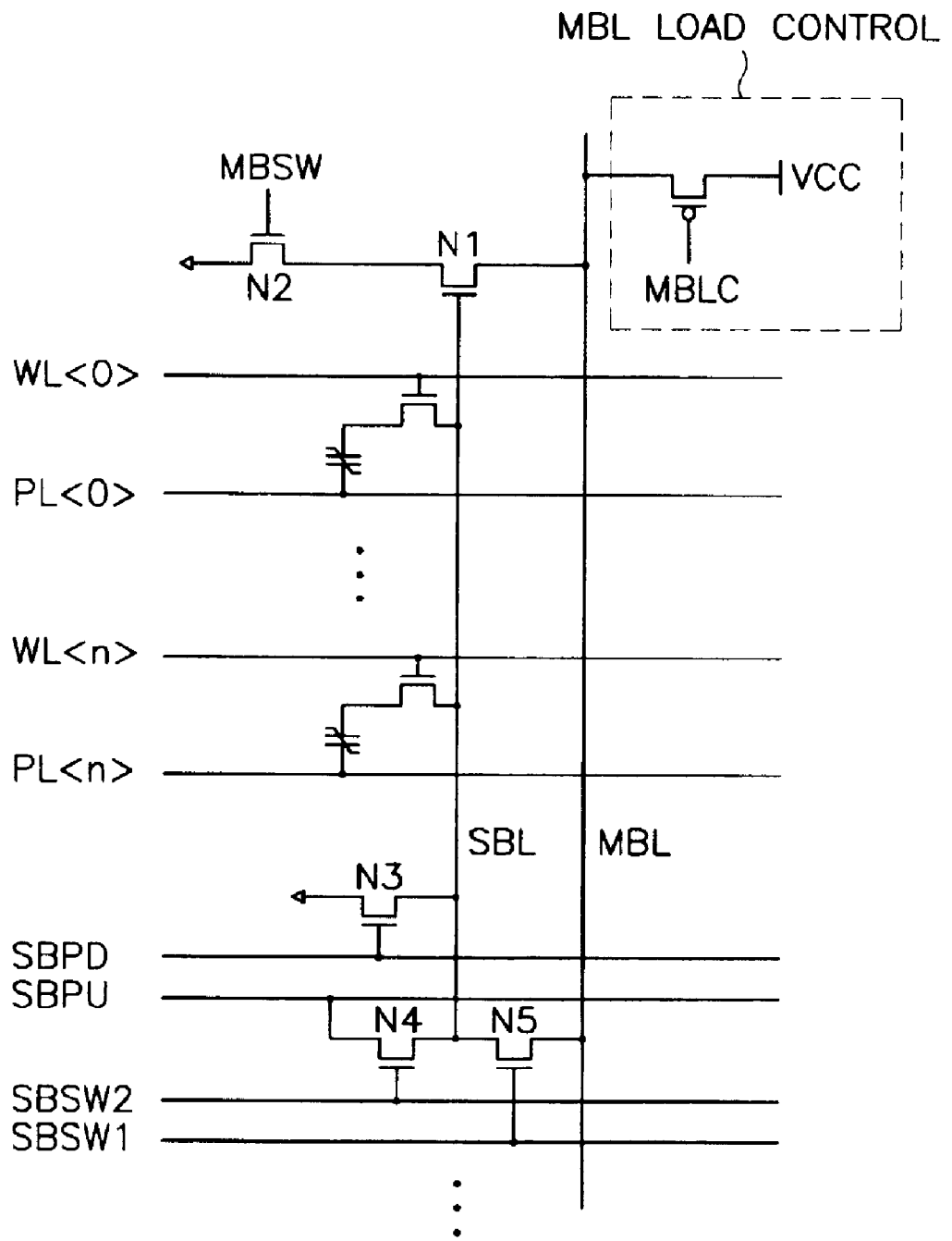
FIG. 14 is a structural diagram illustrating a sub-cell block and the main bitline load controller of the ferroelectric memory device according to the present invention.

FIG. 14 is a structural diagram illustrating a sub-cell block and the main bitline load controller of the ferroelectric memory device according to the present invention.

The sub-cell block comprises a sub-bitline SBL and NMOS transistors N1, N2, N3, N4 and N5. The sub-bitline SBL is connected in common to a plurality of unit memory cells connected to a wordline WL<m> and a plateline PL<m>, respectively. The NMOS transistor N1 for regulating current has a gate connected to the first terminal of the sub bitline SBL and a drain connected to a main bitline MBL. The NMOS transistor N2 has a gate whereto a control signal MBSW is inputted, a drain connected to the source of the NMOS transistor N1 and a source connected to the ground. The NMOS transistor N3 has a gate where to a control signal SBPD is inputted, a drain connected to a second terminal of the sub-bitline SBL and a source connected to the ground. The NMOS transistor N4 has a gate whereto a control signal SBSW2 is inputted, a source connected to the second terminal of the sub-bitline SBL and a drain whereto a control signal SBPU is inputted. The NMOS transistor N5 has a gate whereto a control signal SBSW1 is inputted, a drain connected to the main bitline MBL and a source connected to the second terminal of the sub-bitline SBL.

The control signal SBSW1 reduces the load of the bitlines to that of one sub-bitline SBL by activating the sub-bitline SBL connected to an approached cell.

The voltage of the sub-bitline SBL is pulled down to a ground level when the control signal SBPD for controlling the pull-down NMOS transistor N3 is enabled.

The control signal SBPU is to regulate a power voltage supplied to the sub-bitline SBL. When a "high" voltage is required in a low voltage, a voltage higher than the Vcc voltage is generated and then supplied.

The control signals SBSW1 and SBSW2 are to regulate the signal flow between the control signal SBPU and the sub-bitline SBL. The sub-bitline is connected to a plurality of unit cells.

The sub-bitline SBL connected to the gate of the NMOS transistor N1 regulates a sensing voltage of the main bitline MBL. The source terminal of the NMOS transistor N1 is connected to the drain of the NMOS transistor N2 having a gate whereto the control signal MBSW is inputted.

Figure 15:
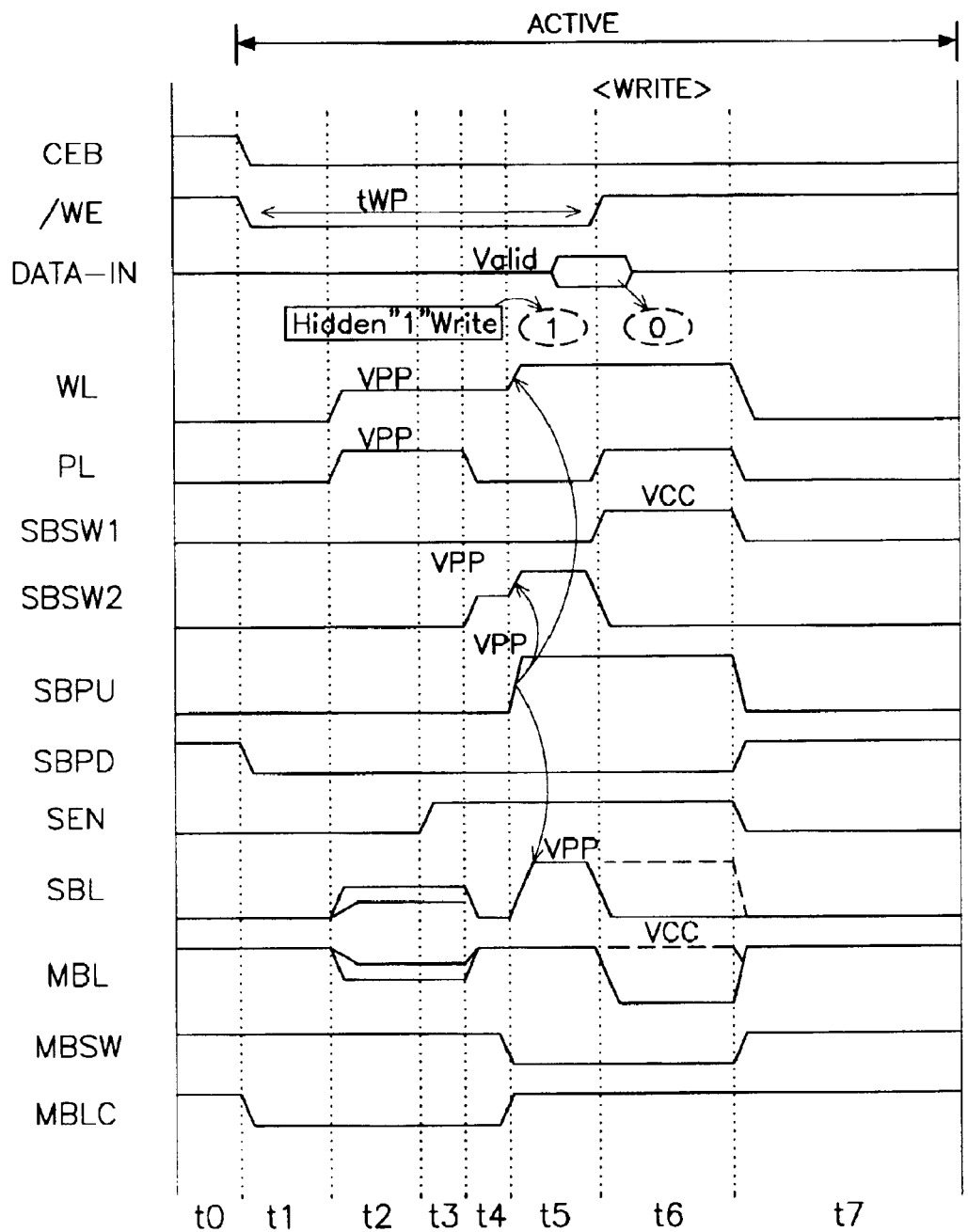
FIG. 15 is a timing diagram illustrating a write operation below a threshold voltage of the ferroelectric memory device according to the present invention.

FIG. 15 is a timing diagram illustrating a write operation below a threshold voltage of the ferroelectric memory device according to the present invention. The wordline WL, the plateline P1, the control signals SBSW2 and SBPU and the sub-bitline SBL are driven to the boosted voltage Vpp.

In the intervals t2 and t3, the data of the cell is detected by activating the wordline WL and the plateline PL.

When the data of the cell is "high", the voltage of the sub-bitline SBL becomes "high". As a result, the current flowing in the NMOS transistor N1 increases, and the voltage of the main bitline MBL becomes lower than the reference level.

On the contrary, when data of the cell is "low", the voltage of the sub-bitline SBL becomes "low". As a result, the current flowing in the NMOS transistor N1 decreases, and then the voltage of the main bitline MBL becomes higher than the reference level.

In the interval t4, a self-boosting is prepared by setting SBSW2 "high".

In the interval t5, a "high" level is written. When SBSW2 is at "high" level and SBPU becomes "high", SBSW2, the wordline WL and the sub-bitline SBL are driven to a "high" level. Here, the voltage levels of these signals are over VPP due to the self-boosting. In the interval t5, a logic value "1" is written in the cell because the wordline WL is "high", the bitline SBL is "high" and the plateline PL is "low".

In the interval t6, a "low" level is written. When the control signals SBPD and SBSW2 are disabled and then SBSW1 is enabled, a logic value "0" provided from the main bitline MBL is provided to the sub-bitline SBL. Here, the logic value "0" is written in the cell the voltage of the plateline P1 is "high". If a logic value of the signal provided from the bitline is "1", the voltage of the plateline PL is "high" as well as the sub-bitline SBL is "high". As a result, data of the cell is not changed and the logic value "1" written in the interval t5 is maintained.

Figure 16:
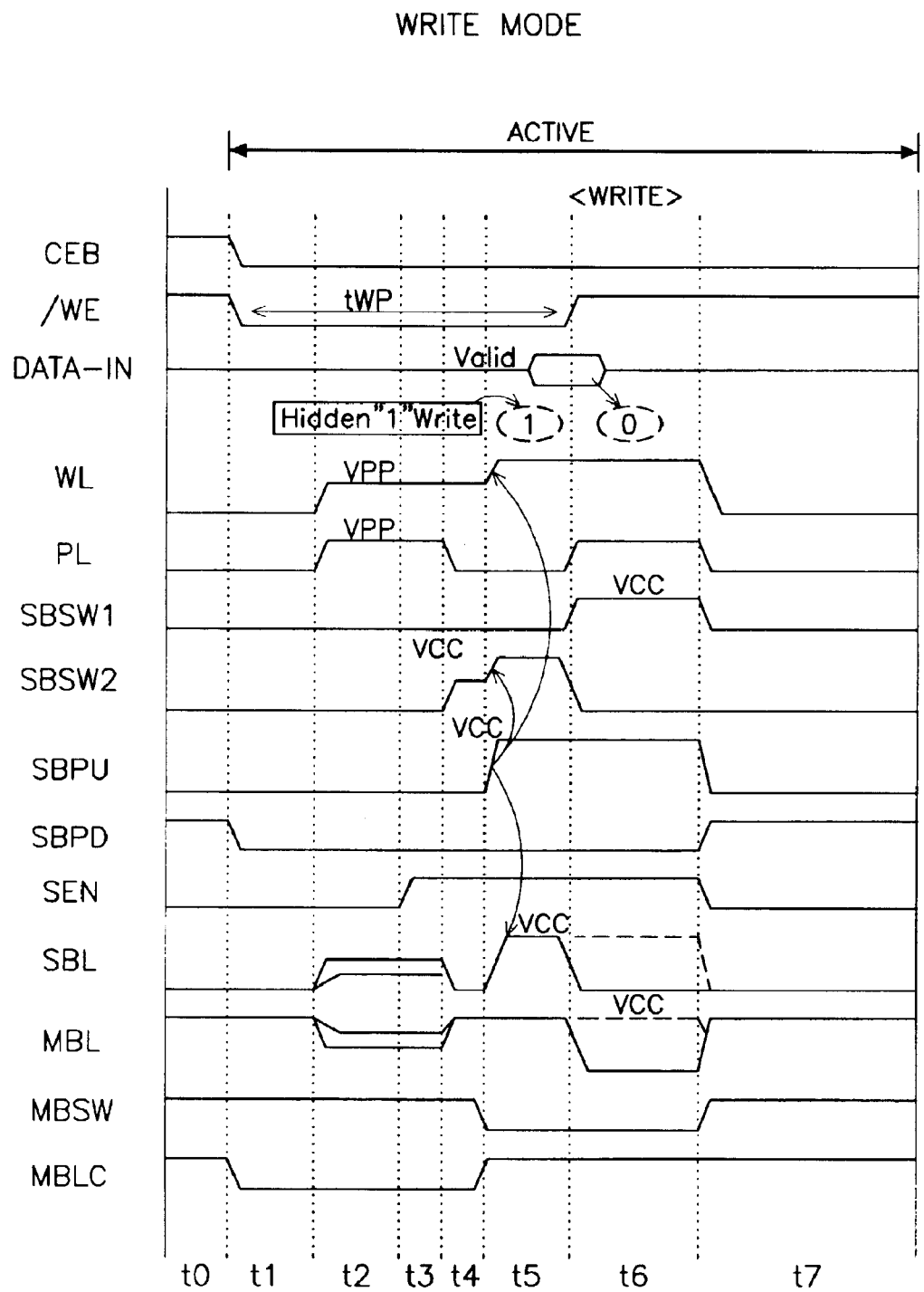
FIG. 16 is a timing diagram illustrating a write operation over a threshold voltage of the ferroelectric memory device according to the present invention.

FIG. 16 is a timing diagram illustrating a write operation over a threshold voltage of the ferroelectric memory device according to the present invention. The wordline WL, the plateline P1, the control signals SBSW2 and SBPU and the sub-bitline SBL are driven to the non-boosted voltage Vcc. The detailed explanation will be omitted because it is as described above.

Figure 17:
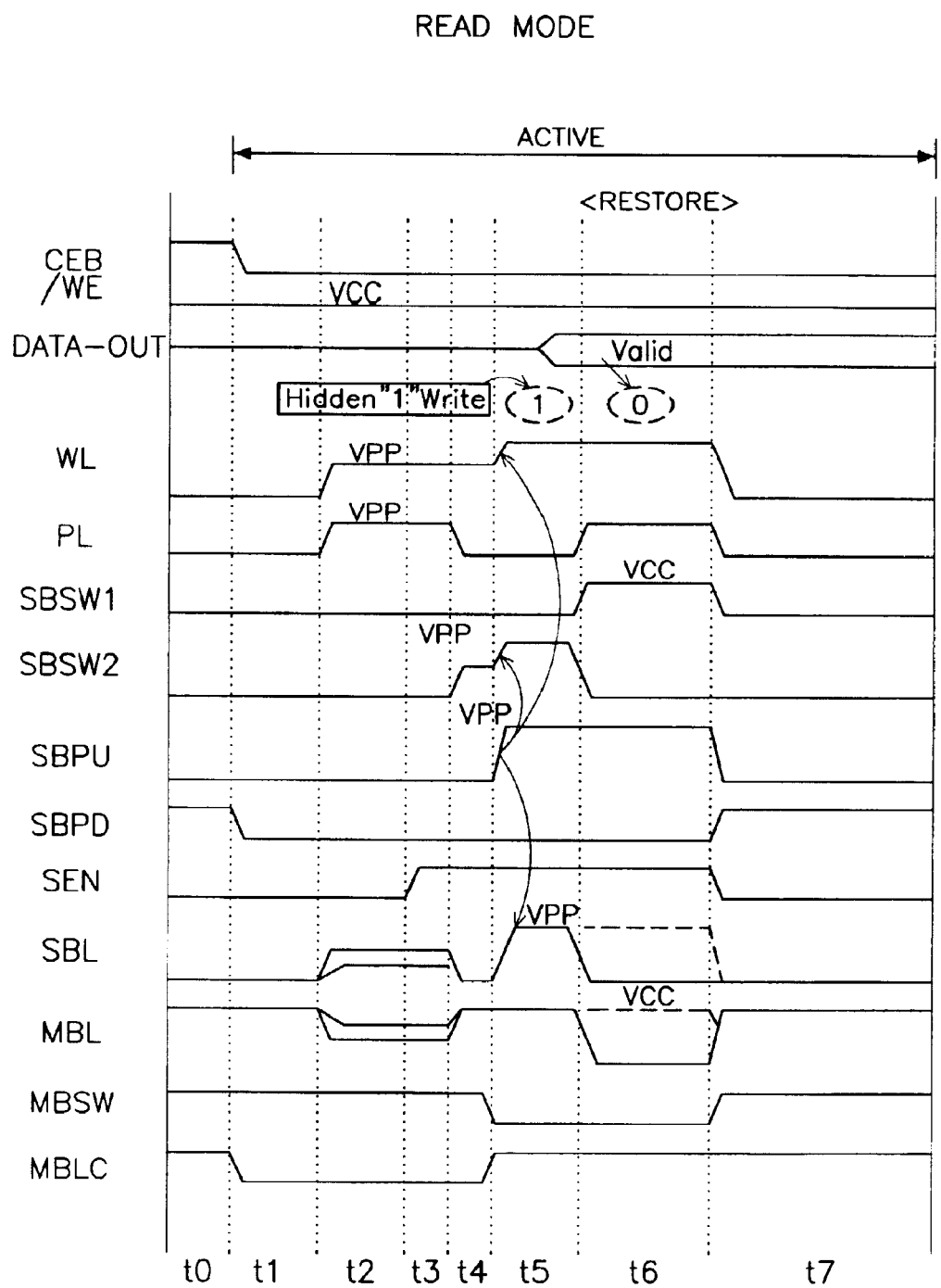
FIG. 17 is a timing diagram illustrating a read operation below a threshold voltage of the ferroelectric memory device according to the present invention.

FIG. 17 is a timing diagram illustrating a read operation below a threshold voltage of the ferroelectric memory device according to the present invention. The wordline WL, the plateline P1, the control signals SBSW2 and SBPU and the sub-bitline SBL are driven to the boosted voltage Vpp.

The operation in the intervals t2 to t6 is as described above. However, data detected in a sense amplifier (not shown) is outputted externally during the read mode.

The intervals t5 and t6 are restoring intervals. In the restore operation, cell data detected and stored in the sense amplifier (not shown) is re-written into the cell. The restore operation is similar to the write operation because the data stored in the sense amplifier is provided through the bitline. Like the write mode, a logic value "1" is automatically written in the cell during the interval t5. When a logic value "0" is provided to the bitline, the "0" is written during the interval t6. However, when a logic value "1" is provided to the bitline, the logic value "1" written in the interval t5 is maintained.

Figure 18:
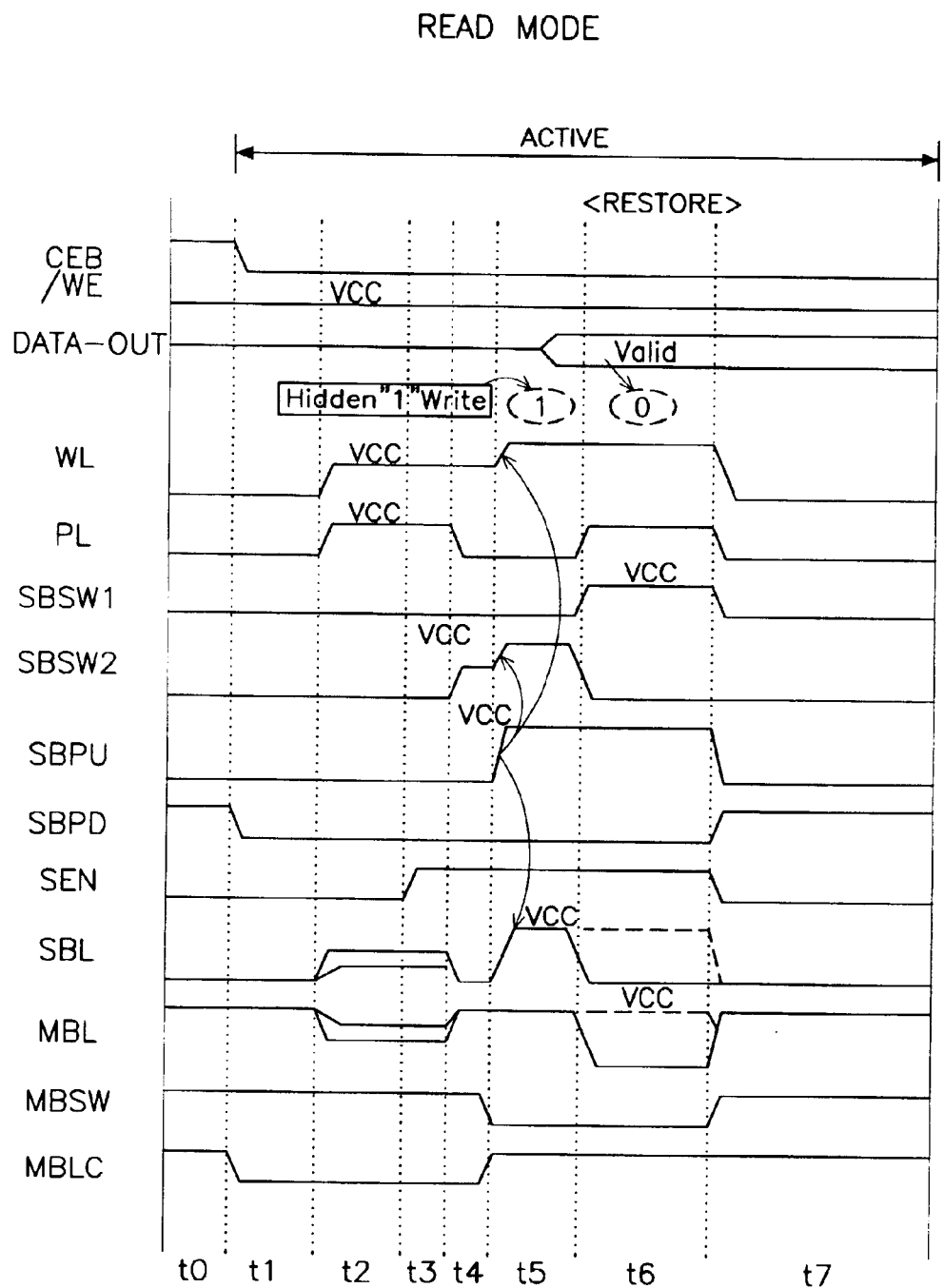
FIG. 18 is a timing diagram illustrating a read operation over a threshold voltage of the ferroelectric memory device according to the present invention.

FIG. 18 is a timing diagram illustrating a read operation over a threshold voltage of the ferroelectric memory device according to the present invention. The wordline WL, the plateline P1, the control signals SBSW2 and SBPU and the sub-bitline SBL are driven to the non-boosted voltage Vcc.

The arrows in FIGS. 15 to 18 represent the self-boosting operation. When a NMOS transistor is turned-on, a gate voltage is higher than a source voltage by a threshold voltage Vth. When a Vcc or Vpp is supplied to the gate and the NMOS transistor is on, the source voltage becomes Vcc−Vth or Vpp−Vth. Here, the self-boosting is used to make the source voltage Vcc or Vpp.

For example, the NMOS transistor N4 of FIG. 14 is explained. When the control signal SBSW2 moves to a "high" level, charges are stored in a parasitic capacitor positioned between the gate SBSW2 and the drain SBPU of the NMOS transistor N4 (the interval t4 of FIG. 15). Here, the voltage of the drain SBPU moves to a "high" level (interval t5 of FIG. 15). Then, the voltage of the gate SBSW2 results in the sum of the voltage of the drain SBPU and the voltage across the parasitic capacitor, thereby boosting the gate voltage. Accordingly, the voltage of the sub-bitline SBL connected to the source of the NMOS transistor N4 is boosted. The self-boosting of the rest area is done as described above.

The ferroelectric memory device according to the present invention may prevent the damage of circuits due to the excessive boost voltage and reduce power consumption by inhibiting the flow of DC current during the standby mode.

The second reference voltage REF_2 stays at a "low" level during the standby mode but moves up to a predetermined level during the chip enable. On the other hand, the first reference voltage REF_1 stays at a "high" level during the standby mode but moves down to a predetermined level. As a result, comparing the two signals may be stabilized, by reducing the noise caused by the glitch.

Additionally, the driving speed may be increased by organizing the cell array block as proposed in the present invention.

What is claimed is:

1. A ferroelectric memory device comprising a driving voltage boost device including:

a boost control signal generator for generating a boost control signal according to a level of a power voltage detected in response to a chip enable signal; and a boost circuit for generating a boost voltage when the boost control signal is enabled and then supplying the boost voltage to memory cells;

each bitline of the ferroelectric memory device including a main bitline and a plurality of sub-bitlines which are connected parallel to the main bitline.

2. The device according to claim 1, wherein the boost control signal generator comprises:

a target voltage generator for generating a first reference voltage representing a threshold voltage;

a voltage detector for generating a second reference voltage representing the detected power voltage; and a comparator for receiving the first and the second reference voltages and then outputting the boost control signal.

3. The device according to claim 1, wherein the boost control signal generator comprises:

voltage detector for generating a second reference voltage representing the detected power voltage; and a comparator for receiving a first reference voltage provided externally and a second reference voltage, and then outputting the boost control signal.

4. The device according to claim 2, wherein the target voltage generator comprises:

a PMOS transistor having a gate connected to the ground and a source connected to a positive power;

a first NMOS transistor having a gate and a drain connected to a drain of the PMOS transistor;

a second NMOS transistor having a gate and a drain connected to a source of the first NMOS transistor; and a third NMOS transistor having a gate whereto the chip enable signal is inputted, a drain connected to a source of the second NMOS transistor and a source connected to the ground, wherein the first reference voltage is identical with the gate voltage of the first NMOS transistor.

5. The device according to claim 2, wherein the target voltage generator comprises:

a PMOS transistor having a gate connected to the ground and a source connected to a positive power;

a first diode having an anode connected to a drain of the PMQS transistor;

a second diode having an anode connected to a cathode of the first diode; and a NMOS transistor having a gate whereto the chip enable signal is inputted, a drain connected to a cathode of the second diode and a source connected to the ground, wherein the first reference voltage is identical with the anode voltage of the first diode.

6. The device according to claim 2, wherein the voltage detector comprises:

a first PMOS transistor having a gate connected to the ground and a source connected to a positive power;

a second PMOS transistor having a gate connected to the ground and a source connected to a drain of the first PMOS transistor;

a first NMOS transistor having a gate and a drain connected to a drain of the first PMOS transistor;

a second NMOS transistor having a gate whereto the chip enable signal is inputted and a drain connected to a source of the first NMOS transistor; and a third NMOS transistor having a gate connected to a positive power, a drain connected to a source of the second NMOS transistor and a source connected to the ground, wherein the second reference voltage is identical with the drain voltage of the third NMOS transistor.

7. The device according to claim 6, wherein the voltage detector further comprises a third PMOS transistor having a gate connected to the ground, a source connected to a positive power and a drain connected to the source of the first NMOS transistor.

8. The device according to claim 2, wherein the comparator comprises:

a first PMOS transistor having a source connected to a positive power;

a second PMOS transistor having a gate connected to a gate of the first PMOS transistor, a source connected to a positive power and a drain connected to a gate;

a first NMOS transistor having a gate whereto the first reference voltage is inputted, a drain connected to a drain of the first PMOS transistor;

a second NMOS transistor having a gate whereto the second reference voltage is inputted and a drain connected to a drain of the second PMOS transistor;

a third NMOS transistor having a gate whereto the chip enable signal is inputted, a drain connected to sources of the first and the second NMOS transistors and a source connected to the ground;

a first inverter having an input terminal connected to the drain of the first PMOS transistor; and a third PMOS transistor having a gate connected to an output terminal of the first inverter, a source connected to a positive power and a drain connected to the drain of the first PMOS transistor, wherein the boost control signal is outputted from the first inverter.

9. The device according to claim 8, wherein the comparator further comprises an inverter chain having the predetermined even number of inverters connected in series, the inverter chain having an input terminal connected to the output terminal of the first inverter and outputting the boost control signal.

10. A ferroelectric memory device comprising:

a main bitline pull-up controller for pulling up a main bitline to positive voltages in response to a first control signal;

a column selection controller for connecting the main bitline with a data bus in response to a column selection control signal;

a cell array connected between the main bitline pull-up controller and the column selection controller; and a driving voltage booster for comparing a predetermined threshold voltage with the detected voltage and providing a driving voltage whose level is regulated according to the result of the comparison.

11. The device according to claim 10, wherein the cell array comprises:

one or more main bitline load controllers connected between a positive power and the main bitline and for controlling current flow in response to a second control signal; and a plurality of sub-cell blocks having both ends connected to the main bitline, respectively, wherein the plurality of sub-cell blocks are arranged between the main bitline pull-up controller and the column selection controller.

12. The device according to claim 10, wherein the main bitline pull-up controller is a PMOS transistor having a gate whereto the first control signal is inputted, a source connected to a positive power and a drain connected to the main bitline.

13. The device according to claim 10, wherein the column selection controller is a transmission gate having a gate whereto the column selection control signal is inputted and both of its ends are connected to the data bus and the main bitline, respectively.

14. The device according to claim 11, wherein the main bitline load controller is a PMOS transistor having a gate whereto the second control signal is inputted, a source connected to a positive power and a drain connected to the main bitline.

15. The device according to claim 11, wherein the sub-cell block comprises:

a sub-bitline connected in common to a plurality of unit memory cells each of which is connected to a wordline and a plateline;

a first NMOS transistor for regulating current, having a gate connected to a first terminal of the sub-bitline and a drain connected to the main bitline;

a second NMOS transistor having a gate whereto a third control signal is inputted, a drain connected to a source of the first NMOS transistor and a source connected to the ground;

a third NMOS transistor having a gate whereto a fourth control signal is inputted, a drain connected to a second terminal of the sub-bitline and a source connected to the ground;

a fourth NMOS transistor having a gate whereto a fifth control signal is inputted, a source connected to a second terminal of the sub-bitline and a drain whereto a sixth control signal is inputted; and a fifth NMOS transistor having a gate whereto a seventh control signal is inputted, a drain connected to the main bitline and a source connected to the second terminal of the sub-bitline, wherein a driving voltage generated from the driving voltage booster is supplied to the wordline, the plateline, the sub-bitline, the fifth and the sixth control signals.

16. The device according to claim 11, wherein one of the main bitline load controllers are connected to the main bitline.

17. The device according to claim 11, wherein two or more of the main bitline load controllers are connected to the main bitline, and the main bitline load controllers are arranged equally apart from each other with the same number of sub-cell blocks between them.

18. The device according to claim 10, wherein the driving voltage booster comprises:

a boost control signal generator for generating a boost control signal according to a level of a power voltage detected in response to a chip enable signal; and a boost circuit for generating a boost voltage when the boost control signal is enabled to supply the boost voltage to memory cells.

19. The device according to claim 18, wherein the boost control signal generator comprises:

a target voltage generator for generating a first reference voltage representing a threshold voltage;

a voltage detector for generating a second reference voltage representing the detected power voltage; and a comparator for receiving the first and the second reference voltages and outputting the boost control signal.

20. The device according to claim 19, wherein the comparator comprises:

a first PMOS transistor having a source connected to a positive power;

a second PMOS transistor having a gate connected to a gate of the first PMOS transistor, a source connected to a positive power and a drain connected to a gate;

a first NMOS transistor having a gate whereto the first reference voltage is inputted and a drain connected to the drain of the first PMOS transistor;

a second NMOS transistor having a gate whereto the second reference voltage is inputted and a drain connected to a drain of the second PMOS transistor;

a third NMOS transistor having a gate whereto the chip enable signal is inputted, a drain connected to sources of the first and the second NMOS transistors and a source connected to the ground;

a first inverter having an input terminal connected to the drain of the first PMOS transistor; and a third PMOS transistor having a gate connected to an output terminal of the first inverter, a source connected to a positive power and a drain connected to the drain of the first PMOS transistor, wherein the boost control signal is outputted from the first inverter.

21. The device according to claim 20, wherein the comparator further comprises an inverter chain having the predetermined even number of inverters connected in series, the inverter chain having an input terminal connected to the output terminal of the first inverter and outputting the boost control signal.

22. The device according to claim 19, wherein the target voltage generator comprises:

a PMOS transistor having a gate connected to the ground and a source connected to a positive power;

a first diode having an anode connected to a drain of the PMOS transistor; a second diode having an anode connected to a cathode of the first diode;

a NMOS transistor having a gate whereto the chip enable signal is inputted, a drain connected to a cathode of the second-diode and a source connected to the ground, wherein the first reference voltage is identical with the anode voltage of the first diode.

23. The device according to claim 19, wherein the voltage detector comprises:

a first PMOS transistor having a gate connected to the ground and a source connected to a positive power;

a second PMOS transistor having a gate connected to the ground and a source connected to a drain of the first PMOS transistor;

a first NMOS transistor having a gate and a drain connected to a drain of the first PMOS transistor;

a second NMOS transistor having a gate whereto the chip enable signal is inputted and a drain connected to the drain of the first NMOS transistor; and a third NMOS transistor having a gate connected to a positive power, a drain connected to the source of the second NMOS transistor and a source connected to the ground, wherein the second reference voltage is identical with the drain voltage of the third NMOS transistor.

24. The device according to claim 23, wherein the voltage detector further comprises a third PMOS transistor having a gate connected to the ground, a source connected to a positive power and a drain connected to the source of the first NMOS transistor.

25. The device according to claim 19, wherein the target voltage generator comprises:

a PMOS transistor having a gate connected to the ground and a source connected to a positive power;

a first NMOS transistor having a gate and a drain connected to a drain of the first PMOS transistor;

a second NMOS transistor having a gate and a drain connected to a source of the first NMOS transistor; and a third NMOS transistor having a gate whereto the chip enable signal is inputted, a drain connected to a source of the second NMOS transistor and a source connected to the ground, wherein the first reference voltage is identical with the gate voltage of the first NMOS transistor.

26. A ferroelectric memory device comprising:

a main bitline pull-up controller for pulling up a main bitline to positive voltages in response to a first control signal;

a column selection controller for connecting the main bitline with a data bus in response to a column selection control signal;

a cell array connected between the main bitline pull-up controller and the column selection controller; and a driving voltage booster for comparing a predetermined threshold voltage with the detected voltage and providing a driving voltage whose level is regulated according to the result of the comparison, said driving voltage booster including, a boost control signal generator for generating a boost control signal according to a level of a power voltage detected in response to a chip enable signal; and a boost circuit for generating a boost voltage when the boost control signal is enabled to supply the boost voltage to memory cells;

said boost control signal generator including, a voltage detector for generating a second reference voltage representing the detected power voltage; and a comparator for receiving a first reference voltage provided externally and a second reference voltage, and then outputting the boost control signal.

* * * * *